United States Patent
Chao et al.

(10) Patent No.: US 7,501,583 B2
(45) Date of Patent: Mar. 10, 2009

(54) LOW NOISE MULTILAYER PRINTED CIRCUIT BOARD

(75) Inventors: Shih-Chieh Chao, Taipei (TW); Chih-Wen Huang, Taipei (TW); Chun-Lin Liao, Taipei (TW)

(73) Assignee: Tatung Company, Taipei (TW)

( * ) Notice: Subject to any disclaimer, the term of this patent is extended or adjusted under 35 U.S.C. 154(b) by 0 days.

(21) Appl. No.: 11/643,830

(22) Filed: Dec. 22, 2006

(65) Prior Publication Data

US 2008/0037237 A1 Feb. 14, 2008

(30) Foreign Application Priority Data

Aug. 9, 2006 (TW) .............................. 95129184 A (51) Int. Cl.
*H05K 1/03* (2006.01)
(52) U.S. Cl. ........................ 174/255; 174/261; 361/794; 361/795; 361/777
(58) Field of Classification Search ......... 361/792–795, 361/777; 174/255, 261; 29/830, 832; 333/257, 333/508
See application file for complete search history.

(56) References Cited

U.S. PATENT DOCUMENTS

| | | | | |
|---|---|---|---|---|
| 4,942,400 A | * | 7/1990 | Tarzaiski et al. ............ | 341/155 |
| 5,068,596 A | * | 11/1991 | Banura ........................ | 323/351 |
| 5,561,584 A | * | 10/1996 | Tang ........................... | 361/220 |
| 5,587,920 A | * | 12/1996 | Muyshondt et al. ........... | 716/15 |
| 5,736,796 A | * | 4/1998 | Price et al. .................. | 307/151 |
| 5,926,377 A | * | 7/1999 | Nakao et al. ................. | 361/763 |
| 6,219,255 B1 | * | 4/2001 | Teshome ..................... | 361/794 |
| 6,473,312 B1 | * | 10/2002 | Hiratsuka et al. ........... | 361/794 |
| 6,988,162 B2 | * | 1/2006 | Goergen ..................... | 710/317 |
| 7,068,518 B2 | * | 6/2006 | Ueno et al. .................. | 361/760 |
| 7,129,419 B2 | * | 10/2006 | Chao et al. .................. | 174/260 |
| 2005/0092520 A1 | * | 5/2005 | Chao et al. .................. | 174/260 |
| 2006/0090929 A1 | * | 5/2006 | Chao et al. .................. | 174/255 |
| 2006/0090930 A1 | * | 5/2006 | Chao et al. .................. | 174/255 |

* cited by examiner

*Primary Examiner*—Jeremy C Norris
*Assistant Examiner*—Xiaoliang Chen
(74) *Attorney, Agent, or Firm*—Bacon & Thomas, PLLC (57) ABSTRACT

A low noise multilayer printed circuit board includes at least one ground layer and at least one power layer. The at least one ground layer is divided into a first area and a second area. The first area and the second area are connected by a first metal neckline. The at least one power layer is divided into a third area and a fourth area. The third area and the fourth area are connected by a second metal neckline. The first area corresponds to the third area. The second area corresponds to the fourth area. The location where the first and second areas are connected by the first metal neckline is different from that where the third and fourth areas are connected by the second metal neckline.

8 Claims, 9 Drawing Sheets

Metal neckline

LOW NOISE MULTILAYER PRINTED CIRCUIT BOARD

BACKGROUND OF THE INVENTION

1. Field of the Invention

The invention relates to the technical field of multilayer printed circuit board (PCB) and, more particularly, to a low noise multilayer PCB.

2. Description of Related Art

Power bus noise caused by the switching of integrated circuits (ICs) such as clock generators or power amplifiers is a significant source of electromagnetic interference (EMI). It may propagate to the other components on the PCB through parallel-plate structure formed by power and ground layer of the PCB. Typically, an isolation method is used to avoid sensitive analog ICs (such as an analog to digital converter) from being influenced by the noise. Namely, some slots are cut on the power and ground metal layers to separate the noise sources into a certain area of the PCB and isolate the noises from being delivered easily to the other circuits.

Figure 1A:
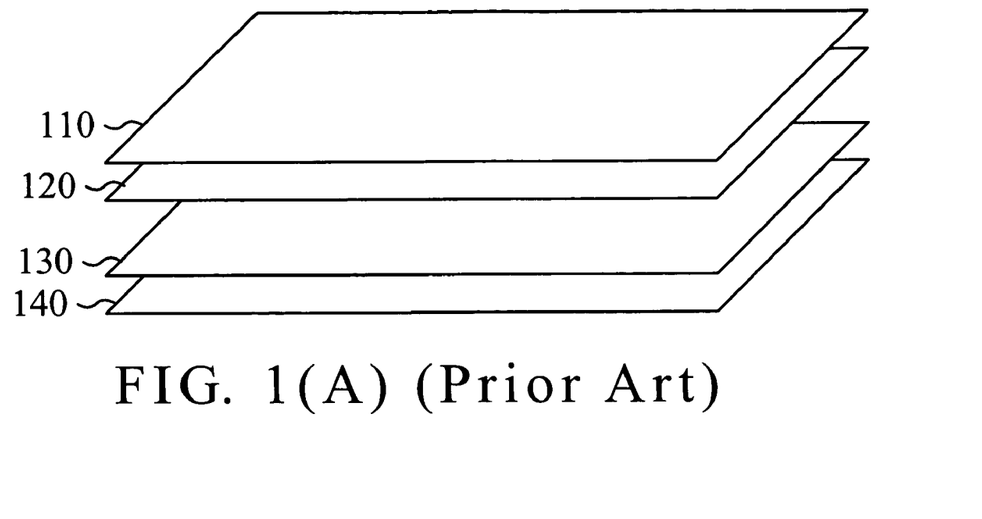
FIG. 1(A) is a schematic view of metal layers of a typical four-layer PCB.

FIG. 1(A) shows the metal layers of a typical four-layer PCB. As shown in FIG. 1(A), two metal layers, power layer 130 and ground layer 120, provide a source and a return current path for the circuit on the PCB, respectively. In addition, the PCB has two signal layers 110 and 140 which provide metal connections of different electronic components on the PCB.

Figure 1B:
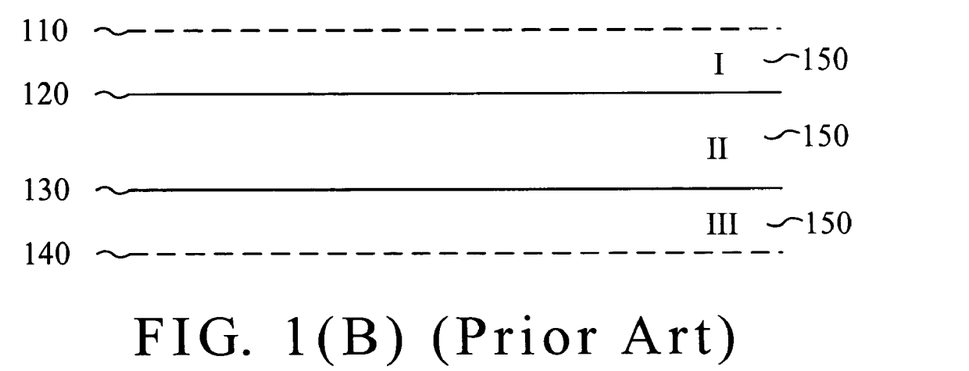
FIG. 1(B) is a cross-sectional view of FIG. 1(A)
Figure 1C:
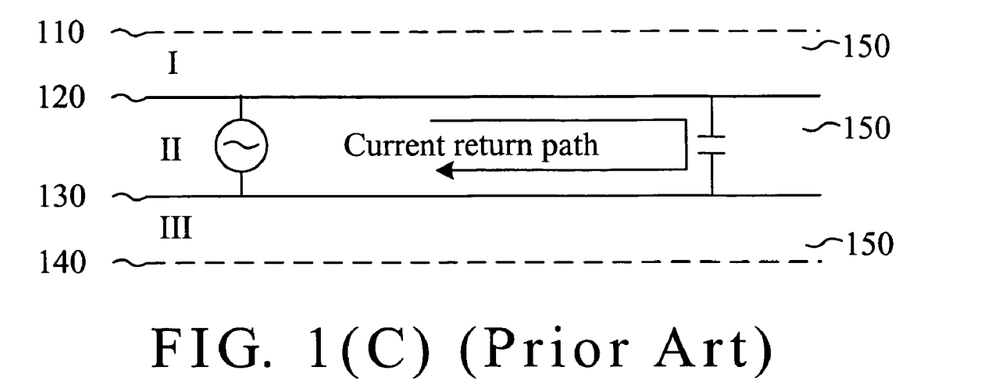
FIG. 1(C) is a schematic view of an area where the power bus noise exits.

FIG. 1(B) is a cross-sectional view of FIG. 1(A). As shown in FIG. 1(B), the dielectric layer 150 on the PCB is divided into three parts by the metal layers. FIG. 1(C) shows the area where the power bus noise exits. Because of the parallel-plate structure formed by the upper and lower metal layers 120 and 130, the region II benefits the electromagnetic propagation.

Figure 2A:
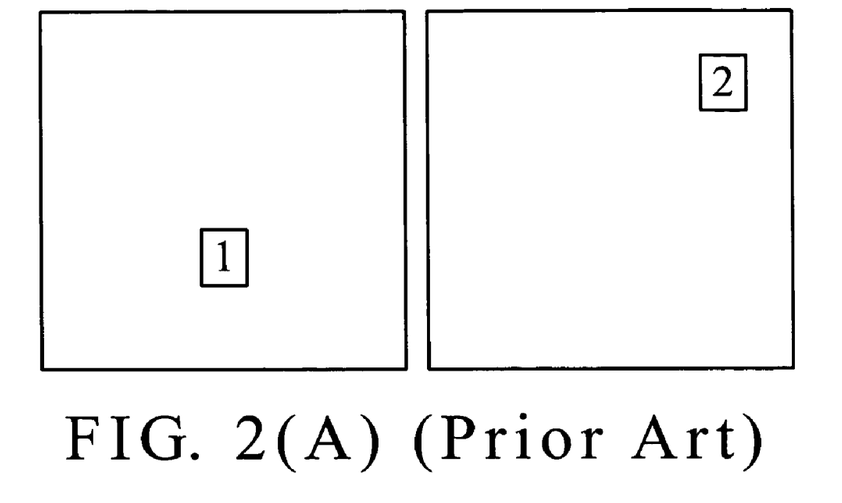
FIG. 2(A) is a top view of using a dividing skill to separate a PCB into two areas in accordance with the prior art.

FIG. 2(A) is a top view of using an isolation method to separate a PCB into two areas in accordance with the prior art. Slots are cut on the power and ground metal layers with identical pattern. Although the isolation effect of this method is quite well, it would make the power layer to be discontinuous and degrade the signal integrity of the signal lines across the gaps.

Figure 1D:
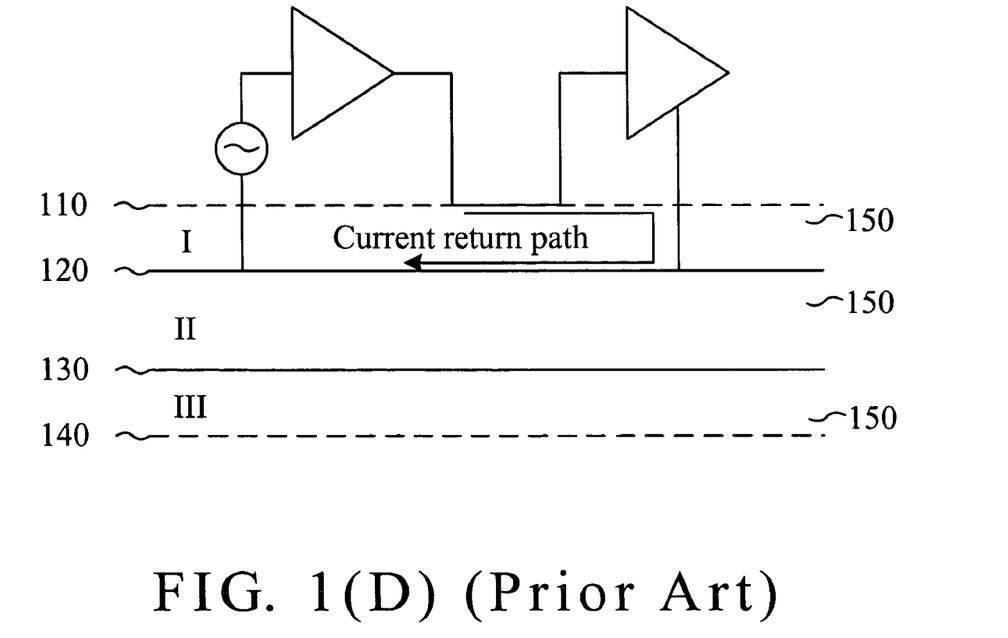
FIG. 1(D) is schematic view of an implementation of components of a typical PCB.

Typically, the circuit components are placed on the top side of the PCB and use the signal layer 110 to route the signal trace as shown in FIG. 1(D). In the circuit theory, the complete current path must form a closed loop. Typically, the return current of the signal trace is flowing on its adjacent layer either the ground layer 120 or the power layer 130. Therefore, if the ground layer 120 or power layer 130 is separated by one or more gaps, the signal integrity of signal traces across the gaps may become worse.

Figure 2B:
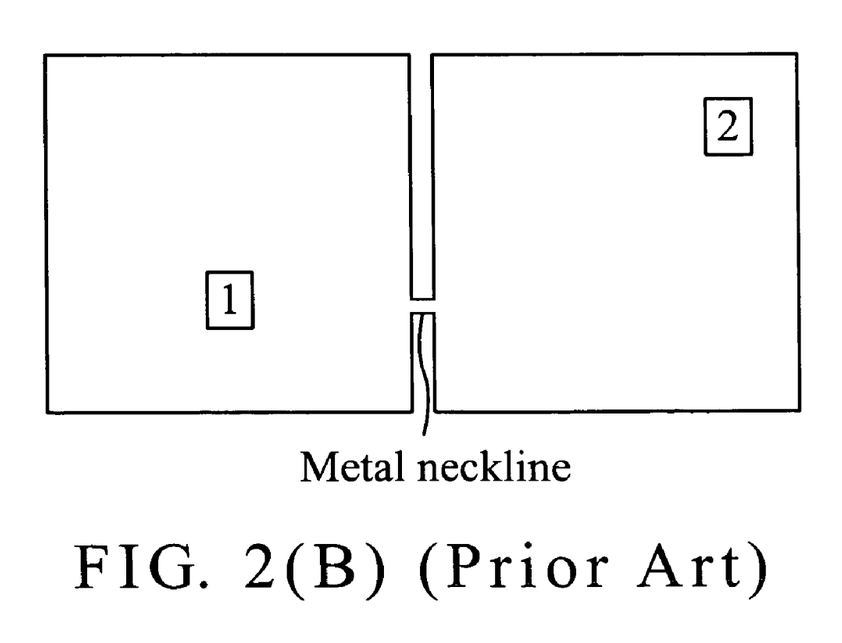
FIG. 2(B) is a schematic view of using a metal neckline to connect the two areas of FIG. 2(A)

To improve the signal integrity, a metal neckline for each of the power layer and ground layer are provided at the location where the signal lines pass through the gap, as shown in FIG. 2(B). For the convenience in the design process, the power layer and the ground layer usually use the same pattern. Namely, the location of the gaps and the metal connections on the power layer and the ground layer are the same.

However, there still exist some disadvantages for such a metal connection. For example, the effect of the isolation will become worse in some frequencies, and become even worse for the increased width of a metal connection.

The previous study shows that using a narrow metal connection on each of the power layer and ground layer can improve the isolation effect, but the signal lines on the adjacent layer are difficult to be routed within the metal connection region. Conversely, using a wider metal connection will make routing of the signal lines to be easy, but the isolation will become worse. Therefore, there is a conflict between the width of the metal connection and the isolation effect in the prior art. There is a need to provide an improved power layer and ground layer structure of the multilayer PCB.

SUMMARY OF THE INVENTION

The object of the invention is to provide a low noise multilayer printed circuit board, which can overcome the cited problems in the prior art.

In accordance with aspect of the present invention, there is provided a low noise multilayer printed circuit board. The low noise multilayer printed circuit board includes at least one ground layer and at least one power layer. The at least one ground layer is divided into a first area and a second area. The first area and the second area are connected by a first metal neckline. The at least one power layer is divided into a third area and a fourth area. The third area and the fourth area are connected by a second metal neckline. The first area corresponds to the third area. The second area corresponds to the fourth area. The location where the first and second areas are connected by the first metal neckline is different from that where the third and fourth areas are connected by the second metal neckline.

Other objects, advantages, and novel features of the invention will become more apparent from the following detailed description when taken in conjunction with the accompanying drawings.

DETAILED DESCRIPTION OF THE PREFERRED EMBODIMENT

Figure 3:
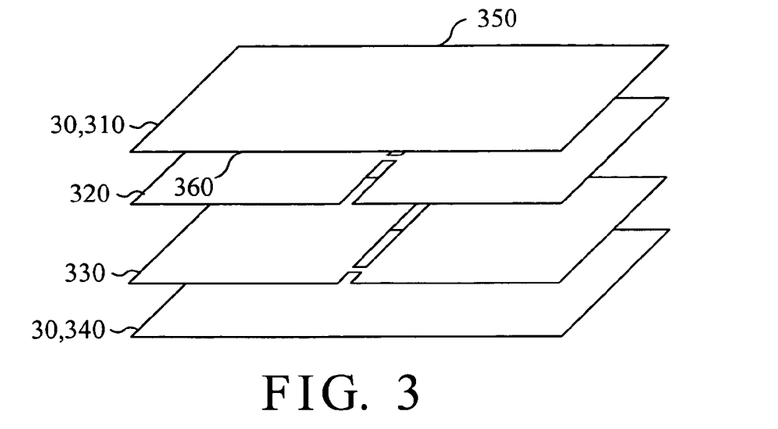
FIG. 3 is a schematic view of a low noise multilayer printed circuit board (PCB) in accordance with the invention.

FIG. 3 is a schematic view of a low noise multilayer printed circuit board (PCB) in accordance with the invention. The multilayer PCB includes one or more ground layer 320, one or more power layers 330 and one or more signal layers 30. In this embodiment, the multilayer PCB includes one ground layer 320, one power layer 330, and two signal layers 310, 340 for providing connections between the pins of electronic components on the multilayer PCB. The multilayer PCB also has a first side 350 and a second side 360.

Figure 4A:
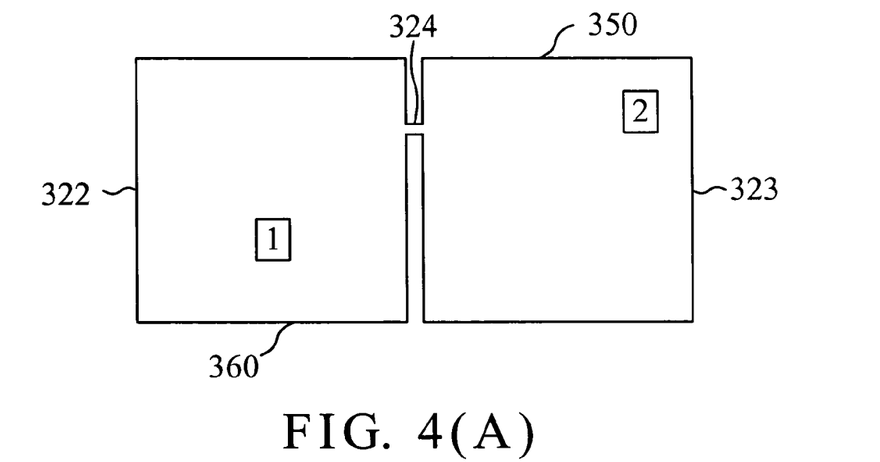
FIG. 4(A) is a top view of at least one ground layer in accordance with the invention.

FIG. 4(A) is a top view of the ground layer 320 in accordance with the invention. The ground layer 320 is divided into a first area 322 and a second area 323. The first area 322 and the second area 323 are connected by a first metal neckline 324.

Figure 4B:
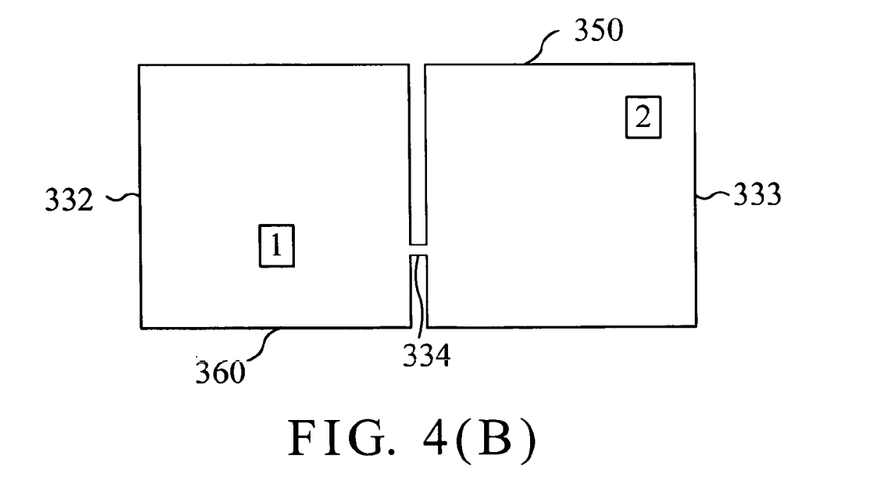
FIG. 4(B) is a top view of at least one power layer in accordance with the invention.

FIG. 4(B) is a top view of the power layer 330 in accordance with the invention. The power layer 330 is divided into a third area 332 and a fourth area 333. The third area 332 and the fourth area 333 are connected, by a second metal neckline 334. The first area 322 corresponds to the third area 332, and their shapes are the same. The second area 323 corresponds to the fourth area 333, and their shapes are the same.

The location where the first and second areas 322 and 323 are connected by the first metal neckline 324 is different from that where the third and fourth areas 332 and 333 are connected by the second metal neckline 334. As shown in FIGS. 4(A) and 4(B), the first metal neckline 324 of the ground layer 320 locates at the first side 350 while the second metal neckline 334 of the power layer 330 locates at the second side 360.

In this embodiment, the first and second areas 322 and 323 are shaped into a rectangle, and locate at two ends of the first metal neckline 324. Since the first area 322 corresponds to the third area 332 and their shapes are the same, and the second area 323 corresponds to the fourth area 333 and their shapes are the same, the third and the fourth areas 332 and 333 are also shaped into the rectangle, and locate at two ends of the second metal neckline 334.

In practical PCB layout, the first area 322 is a digital ground layer while the second area 323 is an analog ground layer, and the third area 332 is a digital power layer while the fourth area 333 is an analog power layer.

In the prior art, the effect of noise isolation is better as the metal neckline is thinner, but the signal lines on the adjacent layer are difficult to be routed within the metal connection region. Conversely, using a wider metal connection will make routing of the signal lines to be easy, but the isolation will become worse.

However, it is observed that the conflict presents in different dielectric layers of the PCB. As shown in FIGS. 1(C) and (D), a good return current path required for the current of the signal lines is associated with the dielectric layer I, but the isolation effect is determined by the dielectric layer II. Accordingly, the invention places the metal necklines of the ground layer and the power layer at different corresponding locations and thereby overcomes the problem.

Figure 5A:
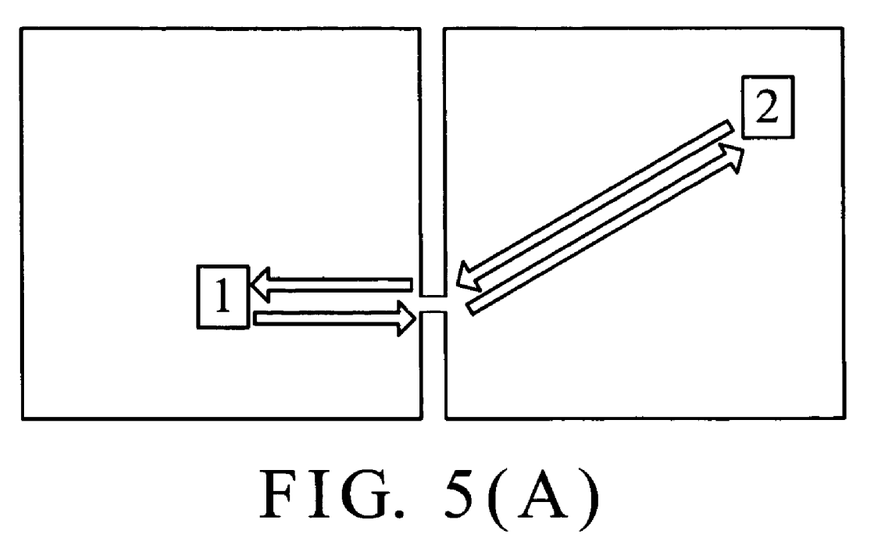
FIG. 5(A) is a schematic view of a typical current flow.
Figure 5B:
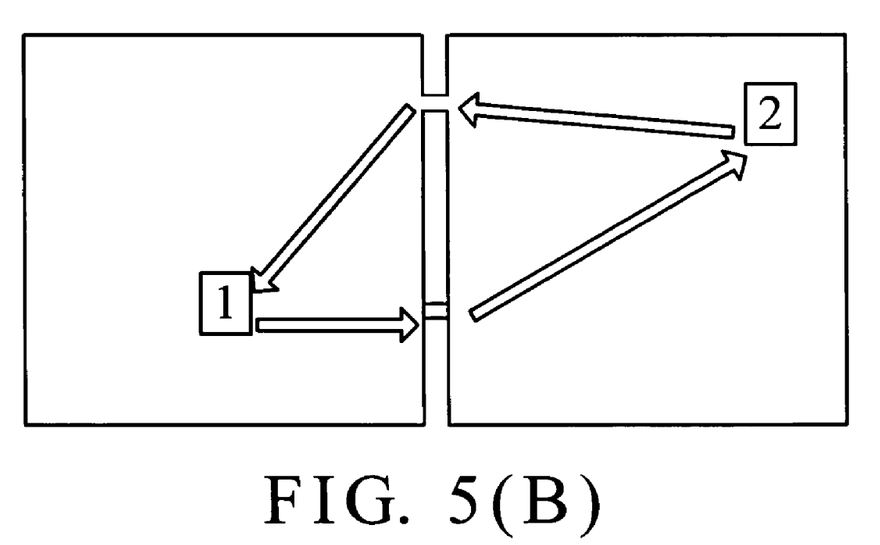
FIG. 5(B) is a schematic view of a current flow in accordance with the invention.

The different locations of the metal necklines of the ground layer and the power layer lead to different noise isolation effect. The difference in the effect of isolation is described with reference to FIGS. 5(A) and (B). II an electromagnetic noise is from port 1 to port 2, the corresponding current flows as indicated by the arrows of FIGS. 5(A) and (B). In FIG. 5(A), the locations of the metal necklines are the same as cited in the prior art, and accordingly the currents of the upper and lower metal layers flow through a same corresponding location. In FIG. 5(B), the locations of the metal necklines are not the same as cited in the invention, and accordingly the current of the upper layer flows through the same corresponding location as shown in FIG. 5(A), but the current of the lower metal layer flows as shown in the arrows in FIG. 5(B). Therefore, the area of the loop of the current in FIG. 5(B) is much larger than that in FIG. 5(A). From the electromagnetic point of view, the inductance of the current loop in the structure of FIG. 5(B) is larger than that in FIG. 5(A), thus the effect of isolation in FIG. 5(B) is better.

Figure 5C:
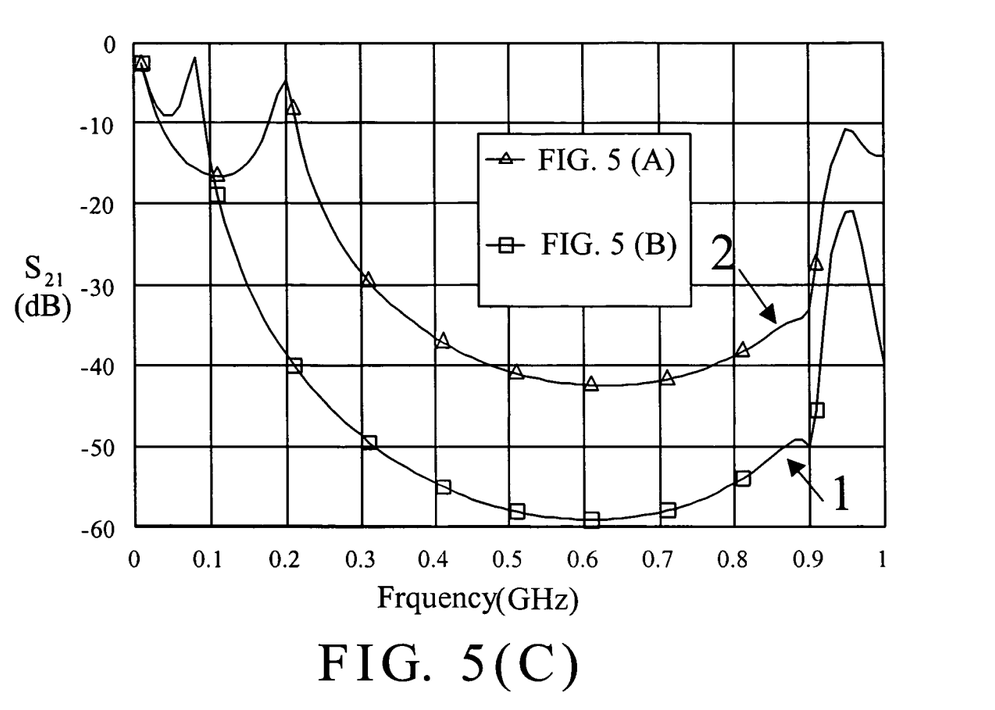
FIG. 5(C) is a graph of a simulation result of the electromagnetic transmission coefficients of FIG. 5(A) and FIG. 5(B) in accordance with the invention.

FIG. 5(C) shows the simulation result of the electromagnetic transmission coefficient $S_{21}$ of the structures of FIG. 5(A) and FIG. 5(B) in accordance with the invention. Curve 1 and Curve 2 indicate the simulation results of the electromagnetic transmission coefficient $S_{21}$ between the ports 1 and 2 of the inventive PCB and prior art respectively. As shown in FIG. 5(C), the invention staggers the locations of the metal necklines of the upper and lower metal layers, which results in lower transmission coefficient from 80 MHz to 1 GHz than that of the prior art. Even the peak is shifted to the lower frequency (from 200 MHz down to 80 MHz). The lower transmission coefficient from 80 MHz to 1 GHz indicates a better isolation between the two ports. In addition, the peak of transmission coefficients at the lower frequency can be eliminated easily using decoupling capacitors. Therefore, the overall effects in the invention are better than those in the prior art.

It is noted that the metal necklines used in FIGS. 5(A) and (B) have a same width, which allows the same number of signal lines routed on the layer adjacent to the metal necklines.

Figure 6A:
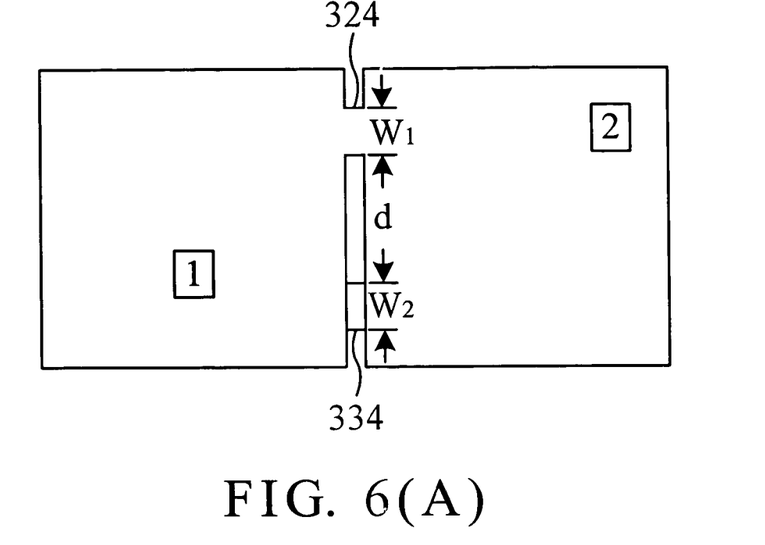
FIG. 6(A) is a schematic view of width changes of upper and lower metal necklines in accordance with the invention.
Figure 6B:
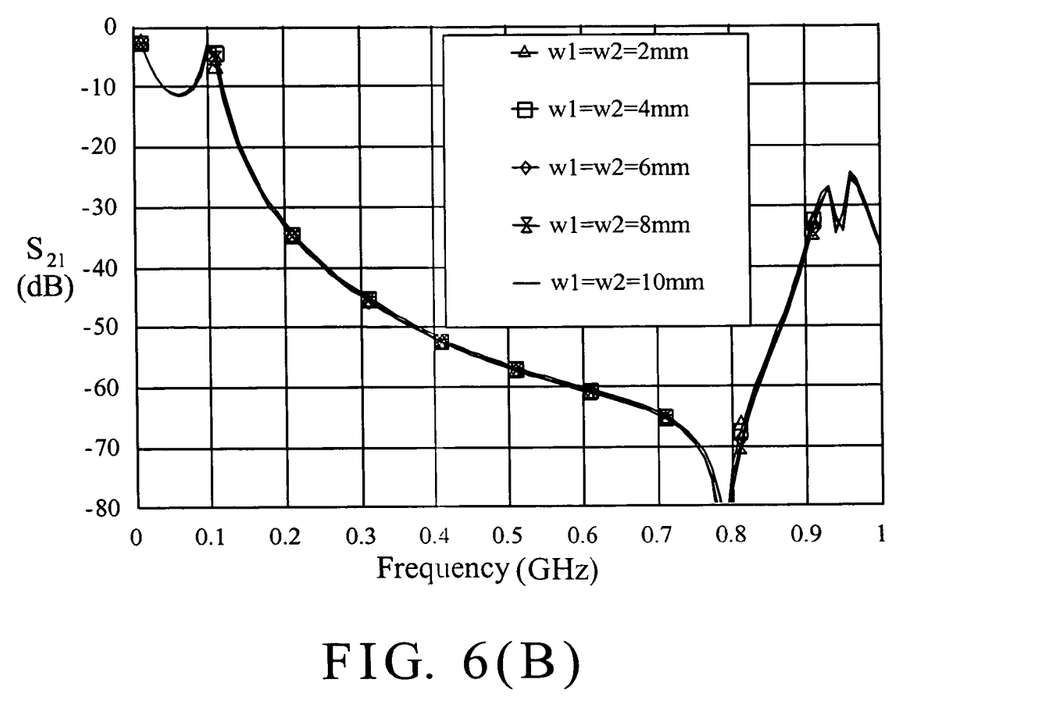
FIG. 6(B) is a graph of a simulation result of the electromagnetic transmission coefficients of the width changes of FIG. 6(A) in accordance with the invention.

FIG. 6(A) is a schematic view of the width changes of the upper and lower metal necklines in accordance with the invention. As shown in FIG. 6(A), d is the distance between the inner edges of the upper and lower metal necklines of the ground layer 320 and the power layer 330 respectively. The corresponding widths of necklines are $W_1$ and $W_2$. FIG. 6(B) shows the simulation result of the electromagnetic transmission coefficient $S_{21}$ for different widths of the neckline in accordance with the invention. As the widths $W_1$ and $W_2$ of the metal necklines increase from 2 mm to 10 mm, the transmission coefficients $S_{21}$ change slightly, which indicates that the isolation between the two ports is not much influenced by the width of the necklines. This is good feature for practical circuit layouts. The devices with data or address buses, such as controllers, memories, and registers generally require parallel connections of a great amount of signal lines. Such devices need a wider metal neckline for the return current path. As shown in FIG. 6(B), the present invention can provide the wider metal neckline as the return current path without reducing the effect on the electromagnetic noise isolation.

Figure 7A:
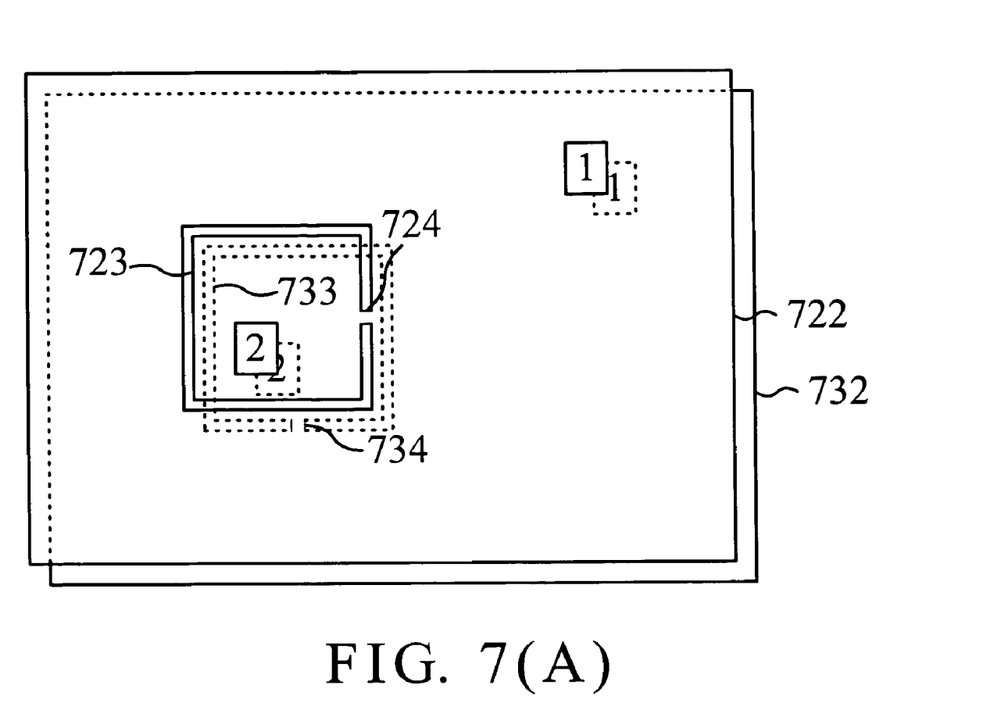
FIG. 7(A) is a schematic view of another embodiment in accordance with the invention.

FIG. 7(A) is a schematic view of another embodiment in accordance with the invention. The shape of the first area 722 is a rectangle with a rectangular opening in the middle. The shape of the second area 723 is a rectangle corresponding to the rectangular opening, has a size slightly smaller than the rectangular opening, and is implemented in the rectangular opening. The third area 732 corresponds to the first area 722, and the shape of the third area 732 is identical to that of the first area 722. The fourth area 733 corresponds to the second area 723, and the shape of the fourth area 733 is identical to that of the second area 723. The locations of the first and second metal necklines 724 and 734 are not the same.

Figure 7B:
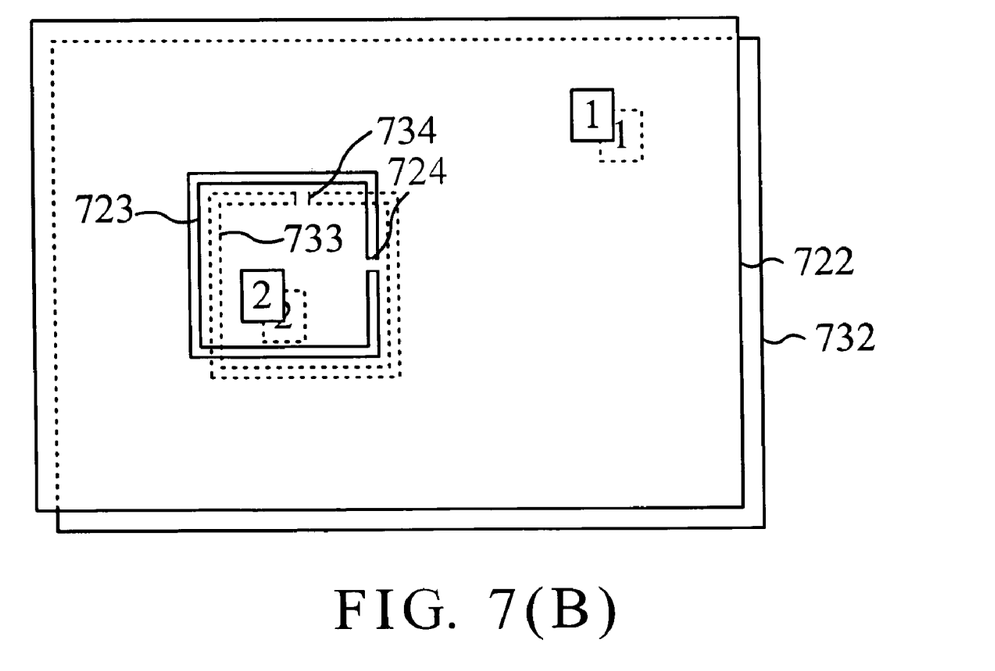
FIG. 7(B) is a schematic view of a further embodiment in accordance with the invention.

FIG. 7(B) is a schematic view of a further embodiment in accordance with the invention. As compared to FIG. 7(A), the difference is in that the second metal neckline 734 locates at the upper of the rectangular opening.

Figure 7C:
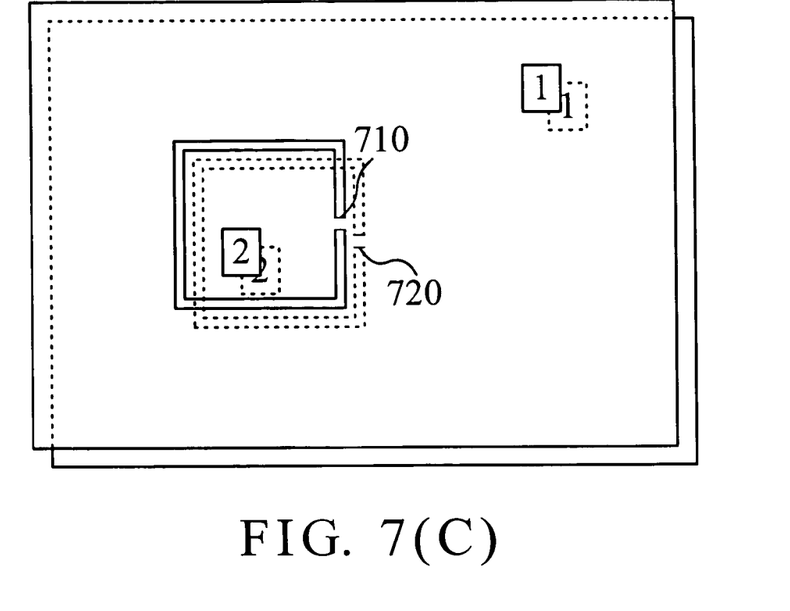
FIG. 7(C) is a schematic view of a typical PCB in accordance with the prior art.

FIG. 7(C) is a schematic view of the prior art. As compared to FIG. 7(A), the difference is that the first metal neckline 710 and the second metal neckline 720 locate at a same location.

Figure 7D:
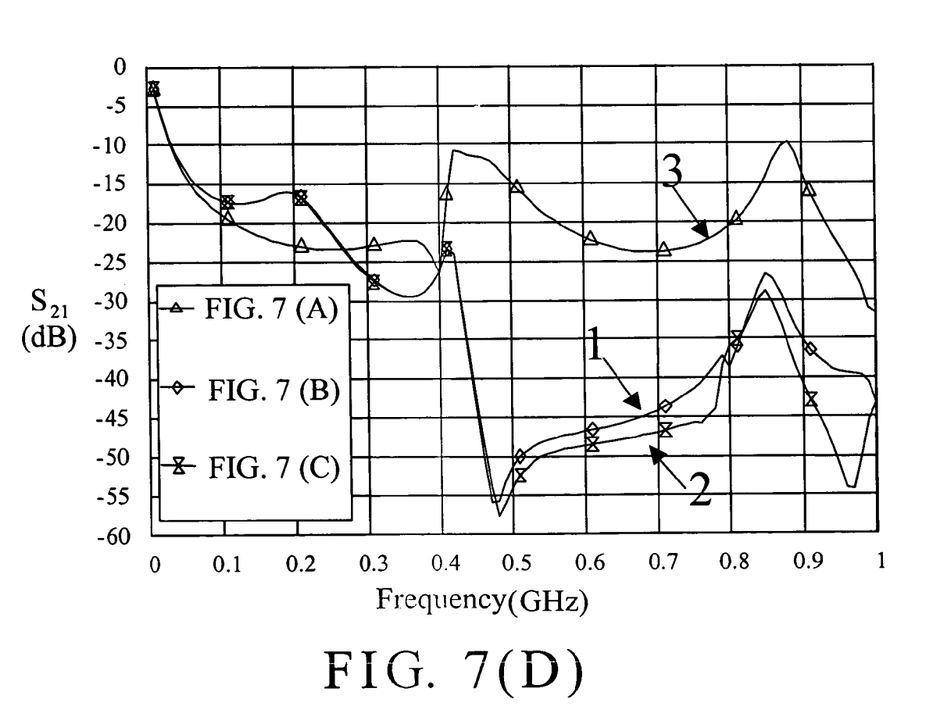
FIG. 7(D) is a graph of a simulation result of the electromagnetic transmission coefficients of FIG. 7(A), FIG. 7(B) and FIG. 7(C) in accordance with the invention.

FIG. 7(D) is the simulation results of the electromagnetic transmission coefficient $S_{21}$ of the structures shown in FIG. 7(A), FIG. 7(B) and FIG. 7(C) in accordance with the invention. Curve 1, 2, 3 indicate the simulation results of the electromagnetic transmission coefficient $S_{21}$ between the ports 1 and 2 of the PCB in FIG. 7(A), FIG. 7(B), and FIG. 7(C) respectively. As shown in FIG. 7(D), the transmission coefficients of the structures in FIGS. 7(A) and (B) are much lower than that of the structure in FIG. 7(C) from 0.4 GHz to 1 GHz which are higher than the resonant frequency of the entire PCB. Therefore, the present invention can significantly prevent the electromagnetic coupling between the two areas.

In this description, the rectangular shapes of the first area 322, the second area 323, the third area 332, the fourth area 333, the first area 722, the second area 723, the third area 732 and the fourth area 733 are given as an example only, not for a limit.

Although the present invention has been explained in relation to its preferred embodiment, it is to be understood that many other possible modifications and variations can be made without departing from the spirit and scope of the invention as hereinafter claimed.

What is claimed is:

1. A low noise multilayer printed circuit board (PCB), comprising:
    at least one ground layer, which is divided into a first area and a second area, the first area and the second area being connected by a first metal neckline;
    at least one power layer, which is divided into a third area and a fourth area, the third area and the fourth area being connected by a second metal neckline;
    wherein the first area is adjacent to the third area, the second area is adjacent to the fourth area, and the location where the first and second areas are connected by the first metal neckline is at a first side of the at least one ground layer and the at least one power layer, and the location where the third and fourth areas are connected by the second metal neckline is at a second side of the at least one ground layer and the at least one power layer, and
    wherein the shapes of the first and the third areas are the same, and the shapes of the second and the fourth areas are the same.

2. The multilayer PCB as claimed in claim 1, further comprising:
    at least one signal layer, which provides connections between pins of electronic components on the multilayer PCB.

3. The multilayer PCB as claimed in claim 1, wherein the first and the second areas are a rectangle and locate at two ends of the first metal neckline.

4. The multilayer PCB as claimed in claim 1, wherein the first area is a rectangle with a rectangular opening in the middle, and the second area is a rectangle corresponding to the rectangular opening, has a size slightly smaller than the rectangular opening, and is implemented in the rectangular opening.

5. The multilayer PCB as claimed in claim 4, wherein the first area is a digital ground layer.

6. The multilayer PCB as claimed in claim 5, wherein the second area is an analog ground layer.

7. The multilayer PCB as claimed in claim 6, wherein the third area is a digital power layer.

8. The multilayer PCB as claimed in claim 7, wherein the fourth area is an analog power layer.

* * * * *